US006762111B2

(12) United States Patent
Fukuda

(10) Patent No.: US 6,762,111 B2
(45) Date of Patent: Jul. 13, 2004

(54) METHOD OF MANUFACTURING A SEMICONDUCTOR DEVICE

(75) Inventor: Hiroshi Fukuda, Kodaira (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/301,702

(22) Filed: Nov. 22, 2002

(65) Prior Publication Data

US 2003/0143761 A1 Jul. 31, 2003

(30) Foreign Application Priority Data

Jan. 30, 2002 (JP) ...................................... 2002-021685

(51) Int. Cl.[7] .............................................. H01I 21/76

(52) U.S. Cl. ...................... 438/401; 438/16; 438/975; 257/797

(58) Field of Search ................................ 438/401, 975, 438/16; 257/797

(56) References Cited

U.S. PATENT DOCUMENTS

| 5,861,320 A | * | 1/1999 | Shiraishi ...................... 438/16 |
| 5,877,036 A | * | 3/1999 | Kawai ......................... 438/16 |
| 6,077,756 A | * | 6/2000 | Lin et al. ..................... 438/401 |
| 6,524,163 B1 | * | 2/2003 | Stirton ......................... 451/5 |
| 6,529,282 B1 | * | 3/2003 | Stirton et al. ................ 356/630 |
| 6,537,713 B2 | * | 3/2003 | Yeo ............................. 430/22 |
| 6,667,253 B2 | * | 12/2003 | Song et al. .................. 438/401 |
| 2002/0137303 A1 | * | 9/2002 | Byers et al. ................. 438/401 |
| 2003/0044702 A1 | * | 3/2003 | Schulz ......................... 430/30 |

OTHER PUBLICATIONS

Semiconductor Industry Association, "Lithography," International Technology Roadmap for Semiconductors, 1999 Edition, pp. 143–148.

Christopher J. Raymond, Mike Littau, Rick Markle, Matthew Purdy, "Scatterometry for shallow trench isolation (STI) process metrology," Proceedings of SPIE, vol. 4344 (2001), pp. 716–725.

Christopher J. Raymond, Mike Littau, Todd Pitts, Peter Nagy, "Asymmetric line profile measurement using angular scatterometry," Proceedings of SPIE, vol. 4344 (2001), pp. 436–446.

"Handbook of Microlithography, Micromachining, and Microfabrication, vol. 1: Microlithography," SPIE Optical Engineering Press; The Institution of Electrical Engineers, vol. 1 (1997), pp. 97–101.

Koichi Sentoku, Takahiro Matsumoto and Hideki Ina, "Novel Strategy for Wafer Induced Shift (WIS)," Proceedings of SPIE, vol. 4691 (2002), pp. 981–989, Mar. 5–8, 2002.

* cited by examiner

Primary Examiner—John F. Niebling
Assistant Examiner—Jennifer M. Kennedy
(74) Attorney, Agent, or Firm—Reed Smith LLP; Stanley P. Fisher, Esq.; Juan Carlos A. Marquez, Esq.

(57) ABSTRACT

Upon formation of semiconductor micro patterns, an interlayer alignment error occurs due to asymmetry of each alignment mark. Prior to alignment of a mask with a wafer, the asymmetry of each alignment mark is measured according to the principle of a scatterometry, and the alignment is performed in consideration of the result of measurement to execute exposure. Thus, high-accuracy alignment can be carried out without sacrificing throughput, and the performance of a semiconductor device is improved. Further, manufacturing yields can be enhanced and a reduction in cost can be realized.

10 Claims, 10 Drawing Sheets

CROSS SECTIONAL VIEW
OF ALIGNMENT MARK

DETECTION SIGNAL
OF ALIGNMENT MARK

CROSS SECTIONAL VIEW
OF ALIGNMENT MARK

DETECTION SIGNAL
OF ALIGNMENT MARK

CROSS SECTIONAL VIEW
OF ALIGNMENT MARK

DETECTION SIGNAL
OF ALIGNMENT MARK

CROSS SECTIONAL VIEW
OF ALIGNMENT MARK

DETECTION SIGNAL
OF ALIGNMENT MARK

----- FOR SYMMETRIC ALIGNMENT MARK
——— FOR ASYMMETRIC ALIGNMENT MARK

X-DIRECTION
ALIGNMENT MARK

TOP-DOWN VIEW

CROSS-SECTIONAL VIEW

Y-DIRECTION
ALIGNMENT MARK

TOP-DOWN VIEW

METHOD OF MANUFACTURING A SEMICONDUCTOR DEVICE

BACKGROUND OF THE INVENTION

1. Field of the Invention

The present invention relates to manufacture of a semiconductor integrated circuit, and particularly to a lithography process for forming circuit patterns employed in the semiconductor integrated circuit with satisfactory accuracy and a lithography apparatus used therein.

2. Description of the Related Art

High-performance/high-function improvements of a semiconductor integrated circuit have been achieved by micro-fabrication/high integration of circuit patterns. The semiconductor integrated circuit is formed by stacking flat or plane circuit pattern layers on one another in a vertical direction in layers. However, there is a need to perform high-accuracy layer-to-layer alignment between upper and lower circuit pattern layers in order to connect between the upper and lower circuit pattern layers. As to the accuracy of this alignment, strict values have been increasingly required with the micro-fabrication of the patterns. In order to achieve such a request, an attempt has been made to improve stage accuracy of an exposure equipment, position accuracy of each pattern on a mask, the sensitivity of detection of alignment marks on a wafer and a mask, etc. The progression of these alignment accuracies and methods thereof have been discussed in, for example, International Technology Roadmap for Semiconductors 1999 Edition (Semiconductor Industry Association, 1999), pp.143–148).

On the other hand, the accuracy required for circuit pattern dimensions has also grown in severity with the micro-fabrication. There is a need to measure the critical dimensions with high accuracy to control the dimensions. Various dimension measuring techniques used for this purpose have been developed. A scanning electron microscope (SEM) is now mainly used for critical dimension measurement. The use of a scatterometry using light diffraction, an atomic force microscope (AFM), etc. has also been discussed. In particular, the scatterometry is capable of measuring sidewall angles and heights of patterns, and the thickness of an underlying film as well as pattern's critical dimensions. The scatterometry has been discussed in, for example, Proceedings of SPIE, Vol. 4344, pp.716–725 (2001)).

SUMMARY OF THE INVENTION

Meanwhile, as the cause of degrading the accuracy of alignment of the wafer with the mask, there was a problem that a detection signal becomes asymmetric due to asymmetry of each alignment mark on the wafer and hence the position of center of the mark is not properly detected, thus resulting in the occurrence of an alignment error. Now consider where such an alignment mark 303 as shown in FIG. 2(a) by way of example, which is formed in a non-alignment layer film 302 on an underlying substrate 301, is observed and such a detection signal as indicated in a lower stage of the same drawing is obtained. When the right and left sidewall angles of the mark whose cross-sectional is to be originally symmetrical as shown in FIG. 2(a), are different from each other (FIG. 2(b)), the bottom of the mark is inclined (FIG. 2 (c)), and a distribution is formed in the thickness of a film (resist film or the like) 304 for covering the corresponding mark (FIG. 2(d)), for example herein, alignment detection signals become asymmetric as shown in the same drawing respectively. It is thus difficult to determine the accurate center of the mark. Since this problem is of a problem ascribable to the wafer in which layer alignment is performed, the present problem cannot be solved by only the above improvements in the stage accuracy, the mask accuracy, the sensitivity of detection of each alignment mark, etc., and an improvement in the performance of each component in an exposure step. A method of reducing the influence of the asymmetry has been proposed for an alignment (positioning) method using a heterodyne detection method. However, it cannot be applied to an alignment method using a mark observed image based on the normal bright field or the dark field imaging method.

An object of the present invention is to provide a method of performing alignment of a mask (transfered image) and a wafer (underlying layer) with satisfactory accuracy and transferring a mask pattern even when the above-described asymmetry of each alignment mark on the wafer exists, thereby manufacturing a high-performance semiconductor device reduced in alignment discrepancy with high yields without sacrificing throughput even when circuit patterns are fine.

The above object is achieved by, in a method of manufacturing a semiconductor device, wherein a second pattern is formed by exposure or graphic-drawing in registration with a first pattern, on a resist film formed over a first pattern layer formed on a substrate, (1) measuring asymmetries of alignment marks (and their peripheries) formed within the first pattern layer, and (2) thereafter performing the alignment using the amount of offset for the alignment, based on the result of measurement. Namely, in a method of manufacturing a semiconductor device, wherein a first pattern formed on a substrate, and a mask having a second pattern or a beam for graphic-drawing the second pattern are aligned with each other, and thereafter a resist film formed over the first pattern is exposed by a projected image of the mask or the beam, thereby forming the second pattern in registration with the first pattern, asymmetry of each of alignment marks (and their peripheries) are measured prior to the alignment signal detection step, a discrepancy between the mark detection signal and a true mark center due to a step for performing the alignment and the asymmetry of the alignment mark is determined from the result of measurement, the alignment signal is corrected using the amount of offset corresponding to the discrepancy, thereby correcting an error produced due to the asymmetry to perform the alignment.

Here, the measurement of the asymmetries of the alignment marks is achieved by irradiating the alignment marks or periodic pattern features close thereto having the same structures as the alignment marks with light and measuring dependence of reflected or diffracted light intensities, a wavelength of the irradiated light on at least any one of incident angle, diffraction order, and polarization-angle of the light.

The step of measuring the asymmetry may preferably be performed during a period before the measurement of each alignment mark within an exposure equipment after the formation of the alignment marks or resist coating. Further, the asymmetry measuring step may preferably be performed within a resist coater equipment for performing the resist coating or within the exposure equipment for performing the exposure.

The step of forming the resist film, the step of measuring the asymmetry and the step of performing the alignment or the step of performing the alignment and exposure or graphic-drawing may preferably be processed for a plurality of wafers in so-called "pipeline" fashion.

DETAILED DESCRIPTION OF THE PREFERRED EMBODIMENTS

Preferred embodiments of the present invention will hereinafter be described in detail with reference to the accompanying drawings.

Figure 1:
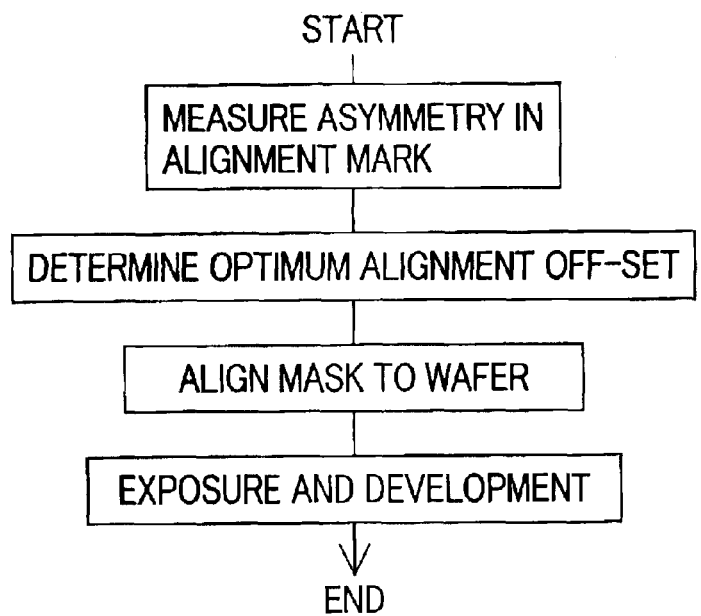
FIG. 1 is a flow chart showing a basic flow of the present invention.

A basic flow of a semiconductor manufacturing method according to the present invention will be explained using FIG. 1. A basic idea of the present invention resides in that prior to alignment of a mask to a wafer, asymmetry of each of alignment marks used for the alignment is first measured, the alignment is performed in consideration of the result thereof, and then an actual exposure is carried out after the elapse of a proper time.

A so-called comprehensive scatterometry for irradiating patterns for the asymmetry measurement with light and measuring the intensities of their reflected diffracted lights can be used for the asymmetry measurement. The comprehensive scatterometry used herein is a generic name for a method of determining information about the size of each pattern, a spatial period, a cross-sectional profile, the structure of an underlying film, etc. from information about dependence or reliance of each diffracted light intensity on an incident angle, its wavelength, its polarized direction or a diffraction order. In the present invention, the asymmetry of each alignment mark is estimated from the above dependence. The measurement of each pattern asymmetry using the scatterometry is of the already-known technology, which has been discussed in, for example, Proceedings of SPIE, Vol. 4344, pp.436–446(2001). However, alternative similar various methods can be applied as will be described later.

Figure 15:
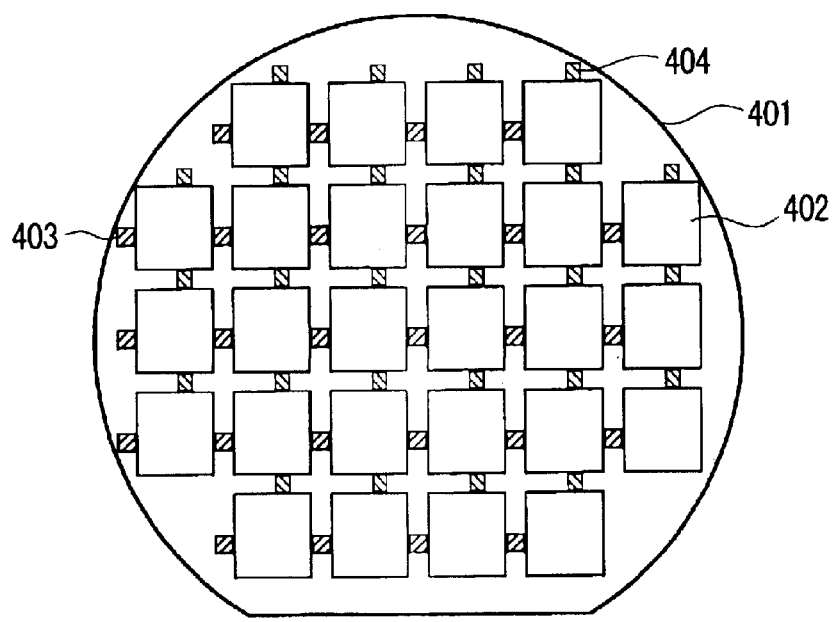
FIG. 15 is a typical diagram depicting a layout example of alignment marks employed in the present invention.

Upon alignment of the mask to the wafer in general, alignment marks formed in a specific pattern layer on an exposed substrate are observed within an exposure equipment to determine positions relative to mask's projected images of the patterns. Since it is necessary to perform alignment with respect to both X and Y directions, there is a need to prepare ones relative to both X and Y directions as the alignment marks. FIG. 15 shows a layout example of alignment marks on a wafer. X-direction alignment marks 403 and Y-direction alignment marks 404 are respectively disposed with respect to chips 402 regularly disposed in the wafer 401. Periodic pattern features or isolated pattern features formed in various critical dimensions are used as the alignment marks.

Figure 16A:
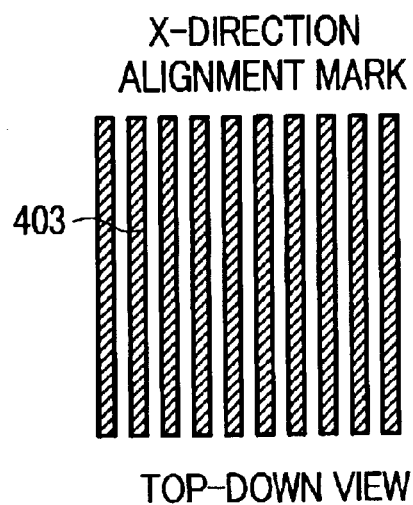
FIGS. 16A and 16B are respectively typical diagrams showing one example illustrative of alignment marks employed in the present invention.
Figure 16A:
Figure 16B:
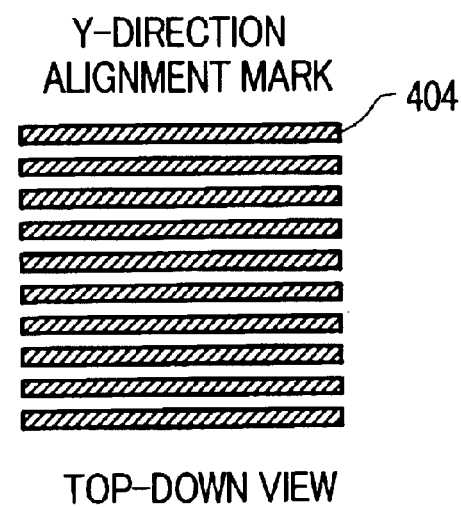
Figure 17:
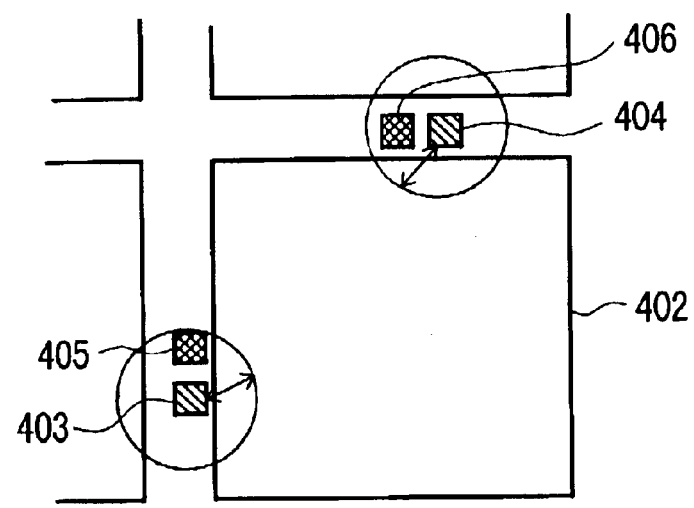
FIG. 17 is a typical diagram illustrating a layout example of asymmetry measurement marks employed in the present invention.

On the other hand, periodic pattern features (diffraction gratings) are used for patterns for asymmetry measurement. When, however, the alignment marks are of the periodic pattern features (diffraction gratings), the alignment marks may be used as the asymmetry measurement patterns. An example illustrative of periodic alignment marks is shown in FIG. 16. As shown in FIG. 17, dedicated patterns 405 and 406 for asymmetry measurement are placed in the neighborhood of the alignment marks as an alternative to the measurement of the alignment marks themselves and may be measured. However, their structures and layout are preferably set to ones similar to the alignment marks. At this time, the asymmetry measurement patterns 405 and 406 may preferably be disposed in the neighborhood of the alignment marks as much as possible, preferably, within a distance of 500 microns (within an area indicated by a circle of FIG. 17). There is no need to effect mark detection on all the marks shown in FIG. 15. A so-called global alignment method may be executed which selects some of the marks and performs their detection. In this case, the mark asymmetry measurement according to the present invention and the alignment correction using the result thereof may preferably be effected on the marks used for the mark detection mainly.

The reliance of each diffracted light intensity on the incident angle, wavelength or diffraction order depends on the asymmetry of each of the alignment marks. Therefore, the relationship between the reliance thereof on these incident angle, wavelength and diffraction order or the like, or the relationship between the various dependencies or dependence s employed in addition to the above and alignment discrepancies between the mask and wafer, which are supposed to occur due to the asymmetry of each of the alignment marks, is obtained in advance by calculation or experiment based on the theory. By comparison of the result of a measurement of actual reflected diffracted-light intensities and the above-described relationship, the amount of offset (offset) to each alignment signal determined based on the relationship between a mark detection signal and a true mark center estimated upon the mask-to-wafer alignment executed within the exposure equipment or the result of mark detection is determined. The alignment of the mask to the wafer is performed based on the relationship between the mark detection signal and the true mark center, or the corrected alignment signal, and exposure is carried after the elapse of a proper time. Thus, the mask and wafer can be aligned properly without depending on the asymmetry of each of the alignment marks.

Various methods can be used as the asymmetry measurement of the alignment marks. An apparatus configuration for the asymmetry measurement employed in the present invention will be described below.

Figure 3:
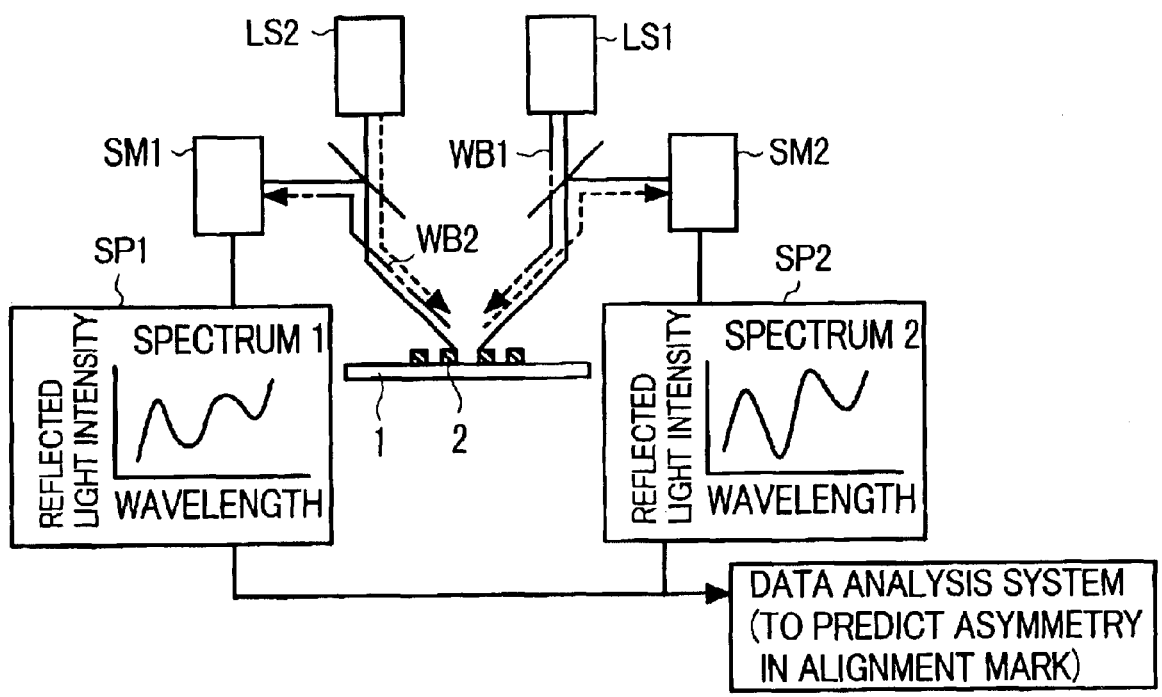
FIG. 3 is a typical diagram illustrating the principle of an asymmetry measuring apparatus employed in the present invention.
Figure 2A:
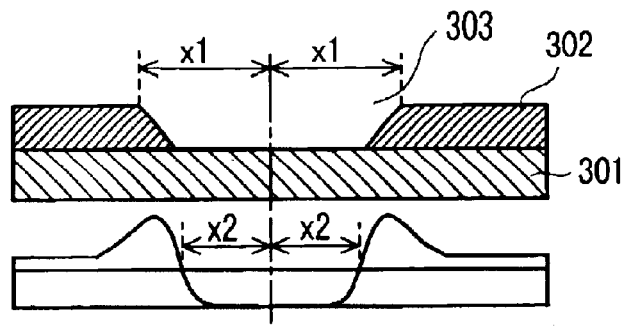
FIGS. 2A through 2D are respectively typical diagrams showing problems that the present invention is to solve.
Figure 2B:
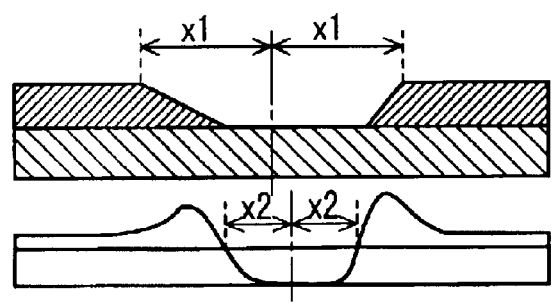
Figure 2C:
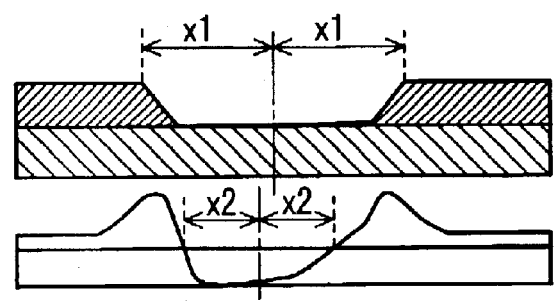
Figure 2D:
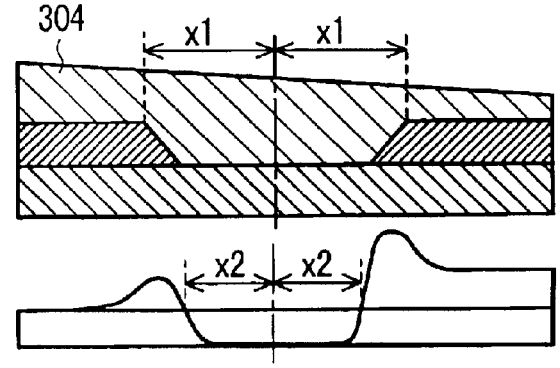

As typically shown in FIG. 3 by way of example, alignment marks 2 with grating structures, which are formed on the surface of a wafer 1, are respectively irradiated from two directions with lights WB1 and WB2 with relatively wide spectral ranges, which are emitted from light sources LS1 and LS2. Spectrometers SM1 and SM2 respectively spectrally analyze their reflected lights or diffracted lights to measure wavelength dependencies (spectrums) SP1 and SP2 of diffracted light intensities. Alignment mark profiles and their asymmetry or influence are predicted from the spectrums SP1 and SP2. When the diffraction gratings are symmetric, the spectrums SP1 and SP2 are equal to each other, whereas when the diffraction gratings are asymmetric, they are not equal to each other. The two directions may preferably be set to substantially symmetric positions with the normal to the wafer surface being interposed therebetween, within a plane including the normal to the wafer surface and the direction normal to each diffraction grating. According to the present configuration, an advantage is brought about in that since no movable part exists in a measurement optical system, stable measurements can be carried out.

Light, which substantially has a single wavelength, is applied to the alignment marks with the grating structures formed on the wafer surface at different plural incident angles to measure their reflected lights or diffracted light intensities, whereby the alignment mark profiles and their asymmetry or influence may be predicted from the incident-angle dependences of the intensities. At this time, each incident angle may preferably be varied in substantially symmetric ranges with the normal to the wafer surface being interposed therebetween, within the plane including the normal to the wafer surface and the direction normal to each diffraction grating.

Figure 4:
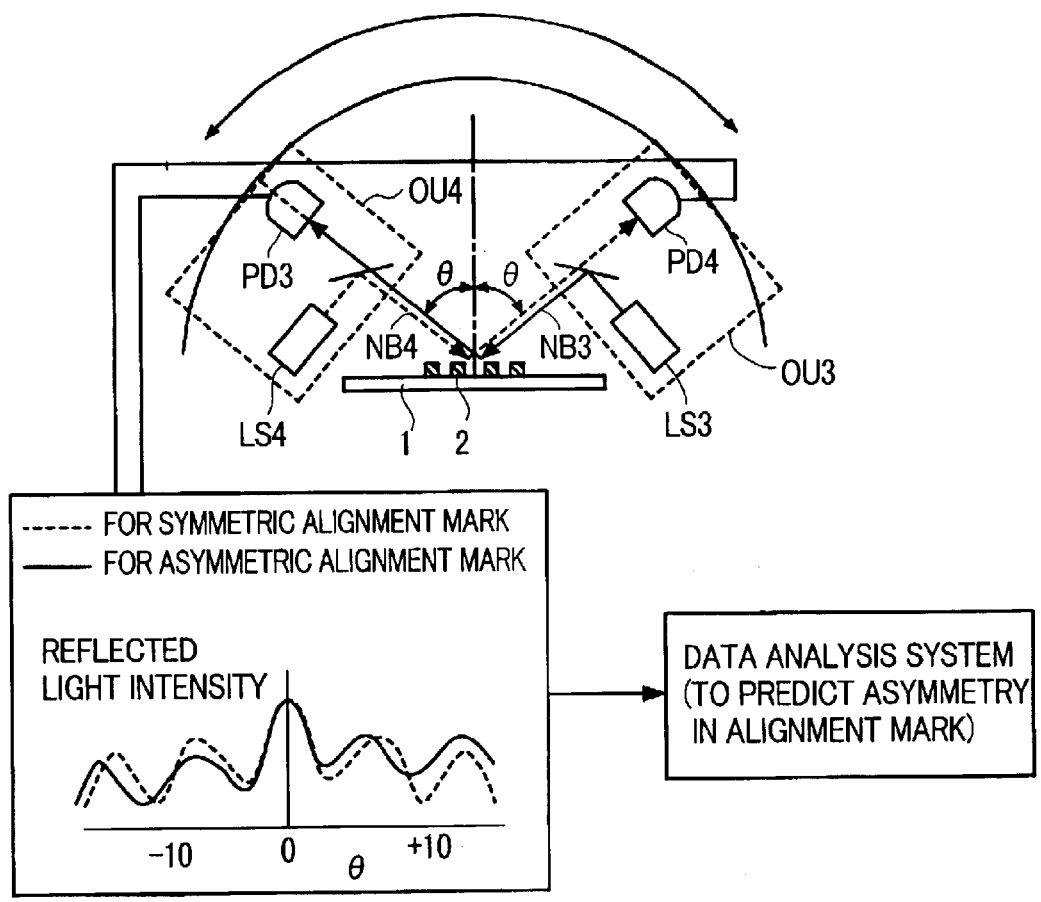
FIG. 4 is a typical diagram showing the principle of another asymmetry measuring apparatus employed in the present invention.

FIG. 4 shows one example of an asymmetry measuring apparatus. Monochromatic lights NB3 and NB4 emitted from light sources LS3 and LS4 are reflected (diffracted) by diffraction gratings 2 formed on the surface of a wafer 1, so that their reflected light intensities are measured by photo-detectors PD3 and PD4 respectively. An optical unit 0U3 comprising the light source LS3 and the photo-detector PD4 and an optical unit 0U4 comprising the light source LS4 and the photo-detector PD3 are moved to change the angles of incidence of the monochromatic lights NB3 and NB4 to the wafer surface (while maintaining the relation that they are symmetric with respect to the normal to the wafer surface), thereby measuring incident-angle dependencies of reflectance. When the diffraction gratings are symmetric, the incident-angle dependences are symmetric with respect to positive and negative incident angles as indicated by a dotted line in the drawing, whereas when the diffraction gratings are asymmetric, they becomes asymmetric as indicated by a solid line in the drawing. The profile asymmetry of the diffraction gratings or the influence thereof is predicted from the measured incident-angle dependencies.

According to the present configuration, an advantage is obtained in that since the single wavelength is used, there is no need to consider wavelength distribution of an optical characteristic of a substance constituting each pattern to be measured, etc.

Figure 5:
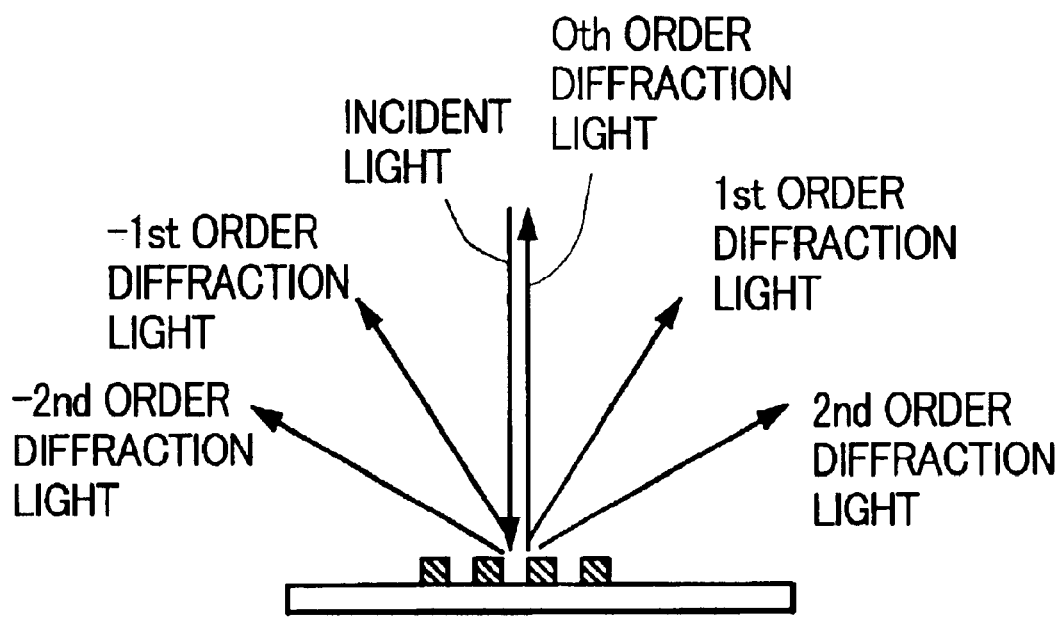
FIG. 5 is a typical diagram depicting the principle of a further asymmetry measuring apparatus employed in the present invention.
Figure 5:
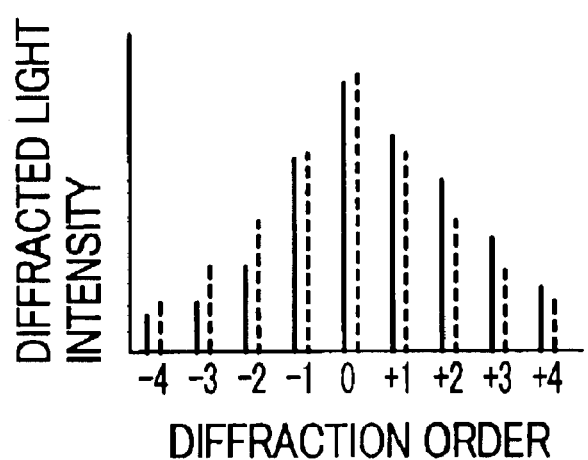

Further, light is applied to alignment marks with grating structures formed on the wafer surface from above as shown on the left side of FIG. 5 to measure diffraction-order dependences of their diffracted light intensities, and alignment mark profiles may be predicted from the diffraction-order dependences measured as shown on the right side of FIG. 5. In particular, the difference in intensity between a set (pair) of diffracted lights (e.g., +1st order diffracted light and −1st order diffracted light) having substantially symmetric diffraction angles with the normal to the wafer surface being interposed therebetween is determined within a plane including the normal to the wafer surface and the direction normal to each diffraction grating, so that each alignment mark asymmetry or its influence can be predicted from the difference. Further, a further improvement in accuracy can be expected by using a result obtained by determining the difference with respect to the diffracted lights different in order, changing the wavelengths of the lights to examine wavelength dependencies corresponding to their differences, or changing incident angles to examine incident-angle dependencies corresponding to their differences.

Figure 6:
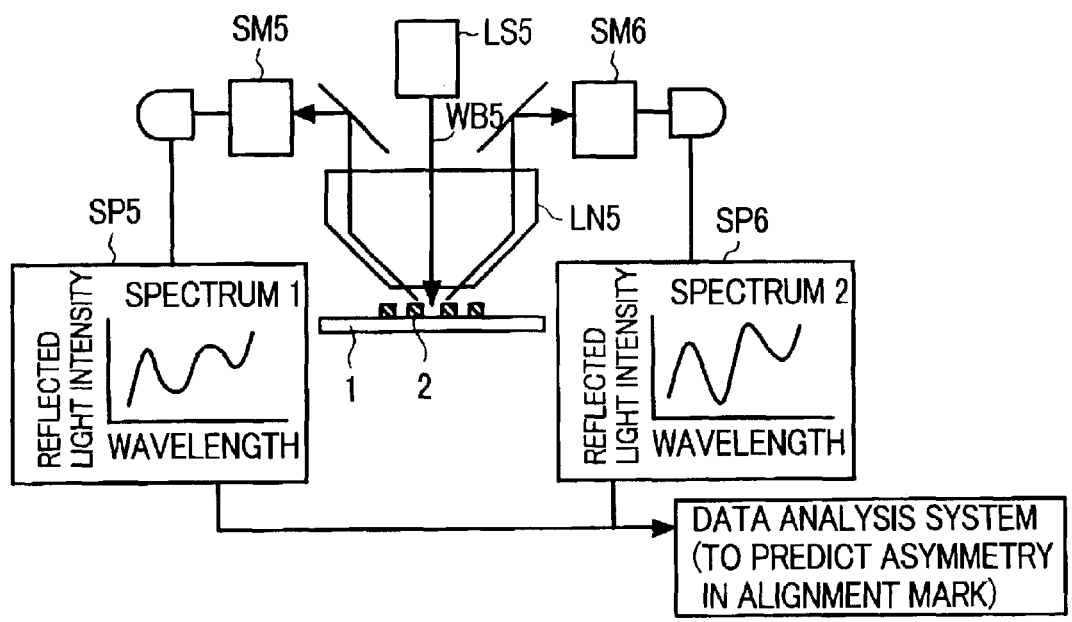
FIG. 6 is a typical diagram illustrating the principle of a still further asymmetry measuring apparatus employed in the present invention.

FIG. 6 shows an example of an apparatus for simultaneously measuring spectrums of a +1st order diffracted light and a −1st order diffracted light to estimate asymmetry. A light WB5 with a relatively wide spectral range emitted from a light source LS5 is applied from the upper surface of a wafer via an objective lens LN5. Spectrometers SM5 and SM6 spectrally analyze the +1st and −1st diffracted lights via the objective lens LN5 respectively to measure wavelength dependences (spectrums) SP5 and SP6 of diffracted light intensities. Alignment mark profiles and their asymmetry or influence are predicted from the spectrums SP5 and SP6. When the diffraction gratings are symmetric, the spectrums SP5 and SP6 are equal to each other, whereas when the diffraction gratings are asymmetric, they are not equal to each other.

As methods for measuring asymmetry, may be used alternative various methods such as a method of vertically launching lights wide in spectral range, having different polarization angles into measurement pattern surfaces and estimating asymmetry from polarization-angle dependences of wavelength spectrums of their reflected light intensities, etc.

Incidentally, while the +1st order diffracted light and the −1st order diffracted light diffracted by the diffraction gratings are used even in the aforementioned heterodyne alignment, the asymmetry of each alignment mark cannot be measured because the two are caused to directly interfere and an alignment signal is obtained directly from their intensities.

The present invention is capable of bringing out a further advantageous effect by being used in cooperation or interlock with other process steps and equipment in a semiconductor manufacturing flow and a manufacturing-device system. In principle, the asymmetry measurement according to the present invention may preferably be performed during a period up to the measurement of alignment marks within the exposure equipment after the formation of the alignment marks, desirably, resist application or coating. As locations for performing measurement, may be taken within a coater developer equipment, an exposure equipment or a stand alone equipment independent of these equipments. Since resist coating and exposure steps and a development step have been continuously carried out in recent years while the coater developer equipment and the exposure equipment are being directly connected to each other, the measuring equipment may also preferably be disposed within either the coater developer equipment or the exposure equipment to perform asymmetry measurement. Further, when an asymmetry measuring apparatus is placed within the coater developer equipment, desired resist patterns are formed by exposure/development and thereafter the critical dimensions and profiles of the resist patterns can be measured by use of the asymmetry measuring apparatus. Namely, the asymmetry measuring apparatus can double as a pattern measuring apparatus based on a so-called scatterometry, which applies light to predetermined periodic resist patterns to examine wavelengths of their diffracted lights or incident-angle dependences thereof or the like, thereby measuring the critical dimensions and profiles of the resist patterns. This is preferable even from the viewpoint of the efficient use of the measuring apparatus, i.e., a reduction in the apparatus cost.

Figure 7:
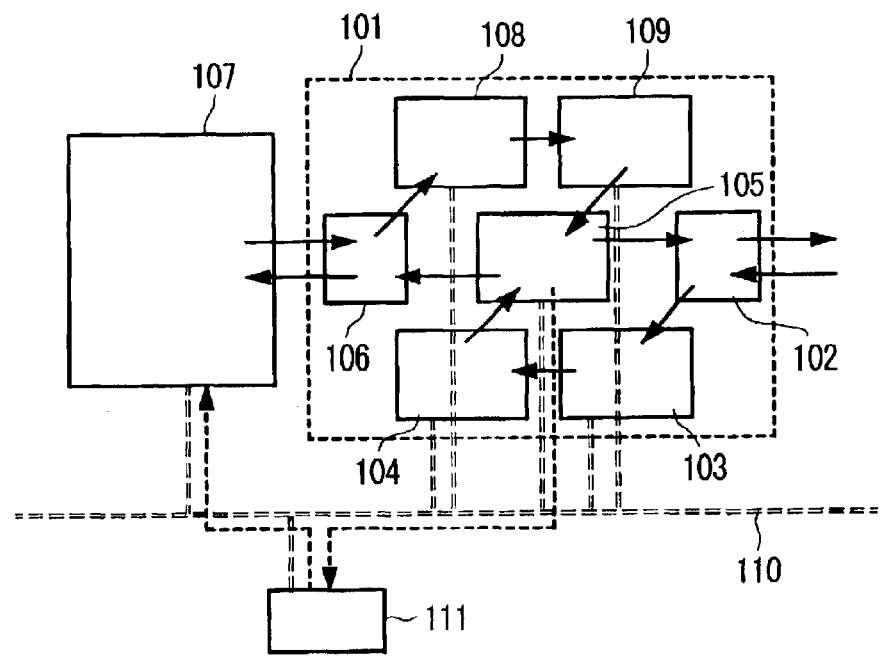
FIG. 7 is a typical diagram showing a configurational example of an asymmetry measuring apparatus employed in the present invention.

A typical layout example of an asymmetry measuring apparatus according to the present invention is shown in FIG. 7. Arrows indicated by thick solid lines in the drawing show flows of wafer processing between apparatuses. A wafer is first formed with a resist film by a resist coating unit 103 and a pre-baking unit 104 via a loader 102 within a coater-developer system 101 and thereafter asymmetry-measured by an optical measurement unit 105. Afterwards, the wafer is moved to an exposure equipment 107 through an interface 106 to the exposure equipment, where alignment and exposure are carried out. Thereafter, the wafer is shifted again to the coater-developer system 101, where resist patterns are formed by a post-exposure baking unit 108 and a development unit 109. After the elapse of an appropriate time interval, the optical measurement unit 105 measures critical dimensions of the post-development resist patterns.

The measuring apparatus may preferably be built in a so-called APC (Automatic Process Control) system. When asymmetry measurement is made by the asymmetry measuring apparatus built in the coater developer equipment, as indicated by a dotted line in FIG. 7 by way of example, the result of its measurement is transmitted to a computer 111 via a network 110, where the amount of an alignment offset set for each alignment mark on the wafer is calculated and this information is sent to the exposure equipment, where it is used in a mask/wafer alignment step.

Figure 8:
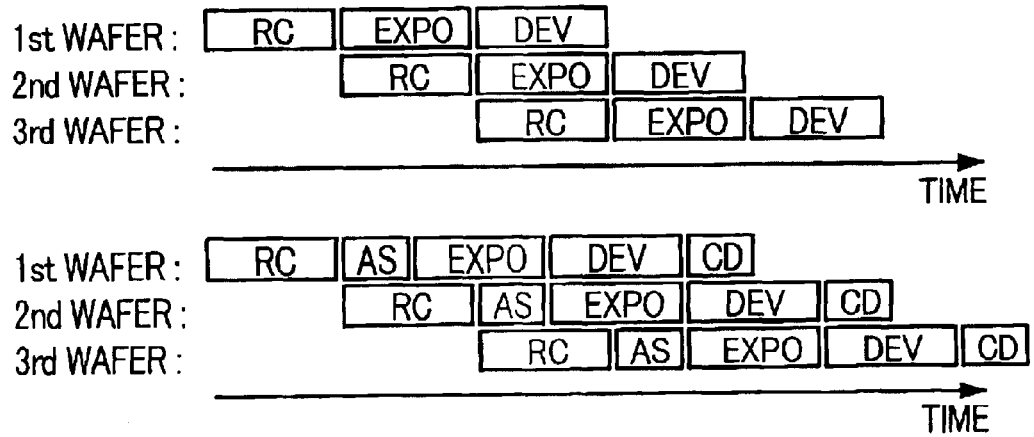
FIG. 8 is a typical diagram depicting one example illustrative of timings of a lithography process according to the present invention.

Further, an asymmetry measurement step AS employed in the present invention is timed with other various steps constituting lithography, i.e., respective steps of a resist film formation step RC, an alignment and exposure step EXPO, a post-exposure baking and development step DEV and a resist critical dimension measurement step CD, so that a reduction in throughput can be avoided even if the asymmetry measurement step AS is added. Namely, a plurality of wafers are continuously processed on a pipeline basis through the above respective steps upon the normal semiconductor wafer process as shown in FIG. 8(a). Thus, the measurement of asymmetry of a certain wafer is performed in parallel with the alignment and exposure of the immediately preceding wafer in this case to thereby make it possible to suppress or control an influence exerted on the whole throughput as extremely low as possible even if the asymmetry measurement is added. Further, when the asymmetric measuring apparatus shares the use of the pattern measuring equipment based on the scatterometry, the critical dimension measurement of the post-development resist patterns is performed on a pipeline basis as shown in FIG. 7 with such timing that the asymmetry measurement and the post-development critical dimension measurement do not overlap each other. Consequently, the present asymmetry measurement can be achieved while an increase in burden is being kept to a minimum even on time and apparatus cost bases.

Typical timings are shown in FIG. 8(b). FIG. 8(b) shows an example in which the asymmetry measurement and the critical dimension measurement are effected on all wafers. However, the present invention is not necessarily limited to it and they may be carried out every plural sheets of wafers.

As products applied to the present invention, the present invention can be applied to general semiconductor devices starting with a logic LSI such as an MPU, an ASIC or the like, a memory LSI, and a system LSI obtained by mixing these. Although application generations may preferably be applied to ones (100 nm node, 70 nm node, etc.) subsequent to a 130 nm node subjected to a harsh demand for alignment accuracy, no particular restriction is imposed thereon. Layers to be applied may preferably be applied between layers subjected to a harsh demand for alignment accuracy, e.g., between an isolation layer and a gate layer employed in a CMOSLSI, the gate layer and a contact hole layer employed therein, the contact hole layer and a first interconnect (wiring) layer employed therein, each wiring layer and a through hole (via) layer employed therein, and the isolation layer and various ion implantation employed therein, etc. No particular restriction is imposed thereon either. In general, the alignment is particularly effective for layers each having marks apt to yield asymmetry in underlying layer, such as marks each having a deep-dug portion or a high projection, marks whose surfaces are planarized by CMP, or the like. On the other hand, an ion-implanted layer or the like in which a demand for alignment accuracy is relatively loose, does not necessarily require the application of the present invention.

<Embodiment 1>

An example in which the method described in the above operational behavior is applied to a process for manufacturing a 130 nm node system LSI semiconductor integrated circuit, will be explained below. Measurements for asymmetry of each alignment mark are effected on a plurality of chips on a plurality of product wafers and thereafter their alignment and exposure are carried out by the exposure equipment through the use of a global alignment method. Further, predetermined heat treatment and development are carried out to form resist patterns. Afterwards, the accuracy of alignment between each resist pattern and an underlying pattern was measured. As a result of measurements of the alignment mark asymmetry on the respective chips on the respective wafers, wavelength wl dependences Rleft (wl) and Rright (wl) of reflected light intensities with respect to right and left incident lights were obtained.

Further, an indicator (measure) S1 of left and right asymmetry for each of the chips on the wafers was obtained from the following expression according to the above result of reliance measurement:

$$S1 = \text{sign}(Rleft(wl0) - Rright(wl0)) \cdot \{(Rleft(wl)Rright(wl))^2 d(wl)\}^{0.5}$$

Expression 1 where sign(x): sign(x)=1(ifx>0) and sign(x)=−1(ifx<0). R(wl) indicates a function indicative of a reflected light intensity for each wavelength wl. According to the above expression, the term of {(Rleft(wl)Rright(wl))²d (wl)}⁰·⁵ represents the magnitude of asymmetry, and the term of sign(Rleft(wl0)−Rright(wl0)) indicates the direction of asymmetry, respectively. Incidentally, when Rleft(wl0)−Rright(wl0)=0, wl is re-calculated based on a large or small wavelength. If the indicator of asymmetry is represented as a function indicative of asymmetry, it is then not necessarily limited to the above expression.

Figure 9:
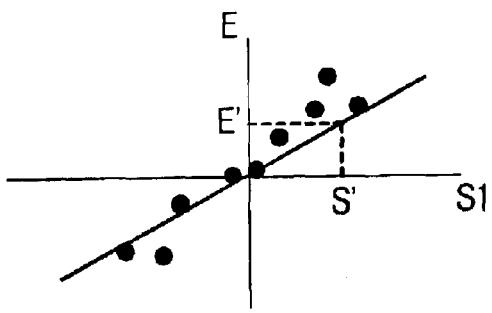
FIG. 9 is a typical diagram showing the relationship between a result of asymmetry measurement and an alignment error both obtained in one embodiment of the present invention.

The relationship between the above S1 and a chip layout magnification error E obtained from the result of measurement of alignment accuracy was examined with respect to the plurality of wafers and chips. Thus, the result of examination was shown in FIG. 9. FIG. 9 shows that when the asymmetry of each mark changes within a wafer surface and between lots, and due to variations with time, the right and left asymmetry indicator S1 varies, and an alignment error occurs due to it. Incidentally, while the collection of data has been continuously performed for a predetermined period to increase the number of samples herein, the relationship of FIG. 9 may be obtained from intentional introduction of asymmetry according to changes in process conditions and mark layouts, etc. Namely, prior to the commencement of work for each product wafer, a wafer having a structure substantially similar to the product wafer and mark asymmetry may be measured to obtain S1 from the expression. Since this relation depends on the structure of each mark and each layer to be applied, it may preferably be changed suitably according to these conditions.

Figure 10:
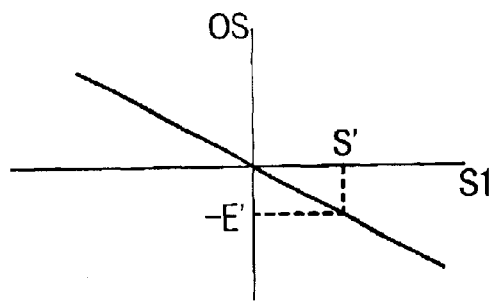
FIG. 10 is a typical diagram illustrating the relationship between a result of asymmetry measurement and an alignment offset to be set, both obtained in the one embodiment of the present invention.

The relationship between the result S1 of asymmetry measurement and the optimum alignment offset OS related to chip layout magnification was next set as shown in FIG. 10 based on the relationship of FIG. 9. Namely, when the asymmetry indicator obtained form the result of measurement was given as S' in the drawing, for example, −E' is inputted as the alignment offset OS to perform exposure, whereby alignment accuracy errors produced due to the asymmetry of each of the marks are canceled out.

Figure 11:
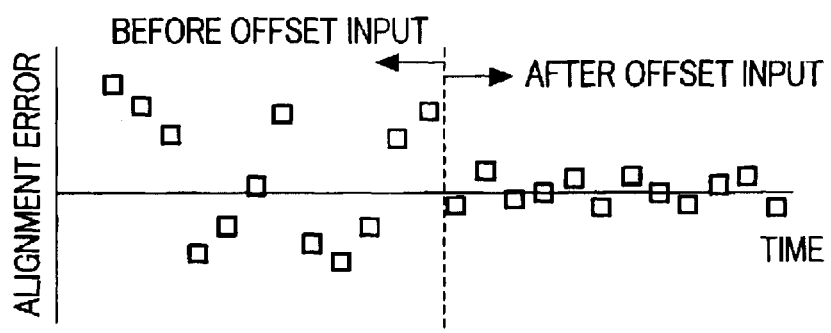
FIG. 11 is a typical diagram depicting the effect of the present invention, which is obtained in the one embodiment of the present invention.

FIG. 11 shows an alignment accuracy measurement result of each product wafer before and after the commencement of the offset input. The chip layout magnification error E decreased from 10 nm to 2 nm owing to the above-described offset setting, and the alignment accuracy was improved. By continuously feeding back alignment accuracy relative to an exposure result of each product wafer, the relationship of FIG. 10 is progressively improved in accuracy. Namely, each pattern formed by exposure and development, and the alignment accuracy of an underbed or underlying base are measured even after the above-described offset application. Thus, the relationship of FIG. 10 may preferably be corrected using chip layout magnification components of each error.

In the global alignment method, an arrangement or layout of all chips is determined based on wafer centers and mark detection results related to several chips. The chip layout magnification error is considered to occur due to the fact that since asymmetry exists in a wafer radius direction on the periphery of each wafer, an observed image thereof is shifted to the corresponding mark position around the wafer as viewed in the radius direction, thus resulting in enlargement or reduction of the whole chip layout or arrangement with respect to the corresponding underlying chip layout as viewed in the radius direction. Incidentally, chip layout magnification errors or the like, and various forms of alignment errors have been discussed in, for example, Handbook of Microlithography, Micromachining, and Microfabrication, Volume 1, pp.97–101, SPIE Press, Bellingham, 1997.

While only the chip layout magnification components of each error have been shown herein, a similar relationship is obtained even with respect to other error components, and offsets for the respective error components may be set based on the asymmetry measurement. While the asymmetry is measured using the apparatus having such a configuration as shown in FIG. 3 herein, various methods can be used in addition to FIGS. 4 and 6, for example if such a configuration that the asymmetry can be measured, is taken. However, when the configuration of FIG. 4 is used, for example, the expression 1 needs to make a change such as the use of reliance R(ia) of a reflected (diffracted) light intensity R on each incident angle ia.

Incidentally, when the proper alignment is considered to fall into difficulties from the measured result of asymmetry even if an offset is set where the asymmetry is large (the absolute value of S1 exceeds a given set value, for example) a warning is given against an apparatus operator or a suitable supervisor before proceeding to an alignment and exposure step, and its judgement may preferably be made. This is similar even to a case in which the accuracy of alignment of each pattern formed by exposure and development and the underlying base do not meet the required specs.

<Embodiment 2>

Figure 12:
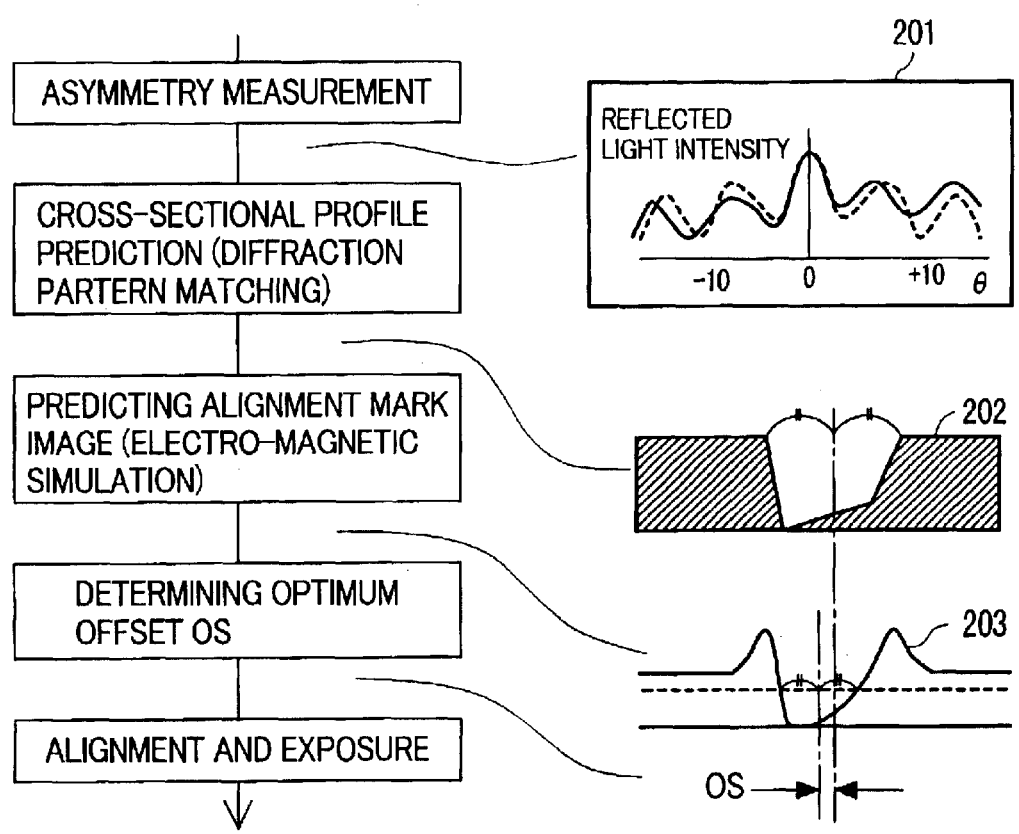
FIG. 12 is a typical diagram showing a flow of an asymmetry correction executed in another embodiment of the present invention.
Figure 13:
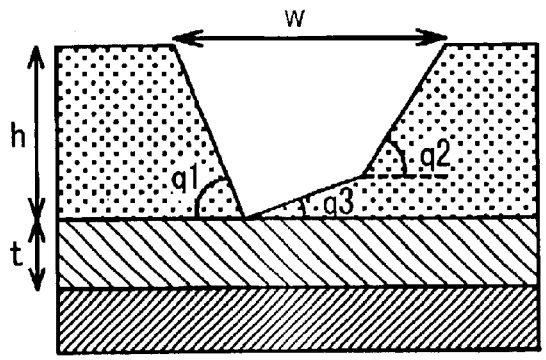
FIG. 13 is a typical diagram illustrating a model of a pattern cross-sectional profile employed in another embodiment of the present invention.

Another embodiment will next be described using FIG. 12. Asymmetry was measured using the apparatus having the configuration shown in FIG. 4. An alignment mark profile 202 was first predicted based on a result of asymmetry measurement 201. Next, an alignment mark detection signal 203 was predicted by simulation from the predicted mark profile. By comparison of the two, the relationship between the detection signal and the position of the asymmetric mark profile becomes apparent. The optimum offset OS was obtained from the relationship between the mark detection signal and a true mark center to thereby perform proper alignment. Afterwards, the mark profile was exposed to form a pattern.

The mark profile prediction was performed by matching (diffraction pattern matching) of incident-angle dependences of reflected (diffracted) light intensities obtained in advance with respect to various mark profiles from theoretical calculations with results of measurements of incident-angle dependences of actual reflected (diffracted) light intensities. Namely, such profile parameters h, t, w, q1, q2 and q3 (q1, q2 and q3: asymmetry profile factors) as shown in FIG. 3 are supposed to correspond to a mark cross-sectional profile. Dependence s R(ia) of reflected (diffracted) light intensities R on incident angles ia are determined by theoretical calculations with respect to various combinations of the parameters. Next, an actual measurement was performed and the combination or set of the parameters in which a deviation (R(ia)−R'(ia)²d(ia) relative to a result of measurement R'(ia) is minimized, was determined. However, the above integration is performed in a negative to positive incident-angle range. The above-described profile predicting method is substantially similar to the pattern profile prediction based on the conventional scatterometry except that in order to measure asymmetry, as shown in FIG. 12, the incident angles of reflected (diffracted) lights are set in two directions with the normal to a wafer surface interposed therebetween to thereby perform asymmetry measurement, and the integration thereof is carried out in a negative to positive incident-angle range. Incidentally, the present measurement is different from the embodiment 1 and was carried out before resist coating.

Next, an observed image obtained by observing a mark with an alignment mark observing apparatus in the exposure equipment was calculated with respect to the predicted mark profile by electro-magnetic simulation. Due to asymmetry, the observed image determined by simulation also results in asymmetry as shown in FIG. 12. Since the electro-magnetic simulation takes time, the electro-magnetic simulation may be effected on the combinations of the respective parameters in advance to determine the corresponding observed image.

According to correspondences between a mark center detected by a mark detection algorithm from the observed image, the true center of each asymmetric mark and its observed image, the relationship between the true mark center and the detected mark center was next determined. The center of an upper opening of the predicted mark cross-sectional profile was regarded as a true mark center. This is a condition under which the area at which the corresponding underlying pattern and a transfer layer pattern to be connected thereto are brought into contact with each other, reaches a maximum. When the electro-magnetic simulation is effected on the combinations of the respective parameters in advance to thereby obtain the corresponding observed image, the optimum amount of offset may preferably be calculated too in conjunction with it. Since, in this case, the optimum amount of offset is immediately determined when the combinations of the parameters are determined by the diffraction pattern matching, an extremely high-speed process is enabled.

Next, the mark center determined above with respect to the observed image of the underlying mark was regarded as the center of the underlying mark. This was aligned with its corresponding alignment mark detection image on the mask to perform exposure.

According to the present embodiment, the estimation of an influence of asymmetry and an alignment correction based on it can be performed without the need to determine an empirical rule between the result of measurement and the optimum offset through the use of the plurality of samples different in asymmetry as in the case of the embodiment 1. While the asymmetry has been measured herein using the apparatus having the configuration of FIG. 4, the present invention is not limited to it if such a configuration that the asymmetry can be measured, is taken. For example, the configurations shown in FIGS. 3 and 6 may be used. In this case, diffraction pattern matching is performed using a wavelength wl-reliance R(wl) of a reflected (diffracted) light intensity R.

<Embodiment 3>

Alignment marks were detected with respect to various wafers and chips in a manner similar to the embodiment 1. The following expression was used for the detected alignment marks to calculate an asymmetry parameter S2.

$$S2 = \text{sign}(I(x0) - I(-x0)) \cdot \{(Ix)I(-x))^2 dx\}^{0.5}$$ Expression 2

(where x=0: center of gravity of mark signal). Thereafter, alignment was performed according to a normal method to thereby measure an alignment error E between each resist pattern formed by exposure and development and its corresponding underlying pattern. The above operation was effected on a plurality of samples different in asymmetry of each alignment mark to thereby determine the relationship between the asymmetry parameter S2 and the alignment error E. The asymmetry parameter is not limited to the above expression if given as a function indicative of asymmetry.

Figure 14:
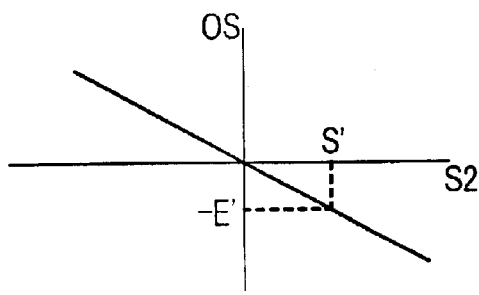
FIG. 14 is a typical diagram showing the relationship between a result of asymmetry measurement and an alignment offset to be set, both obtained in another embodiment of the present invention.

Next, the relationship between the asymmetry parameter S2 and an optimum alignment offset OS was determined from the above relationship as shown in FIG. 14 in a manner similar to the embodiment 1. Thereafter, the above expression is first used for a detected alignment mark signal in an alignment step to thereby calculate an asymmetry parameter. An alignment offset was determined from the result of calculation by use of FIG. 14. The alignment offset was set so as to carry out alignment. According to the present embodiment, the correction of the alignment error by the mark asymmetry is enabled without using a specific asymmetry measuring apparatus.

<Embodiment 4>

Figure 18:
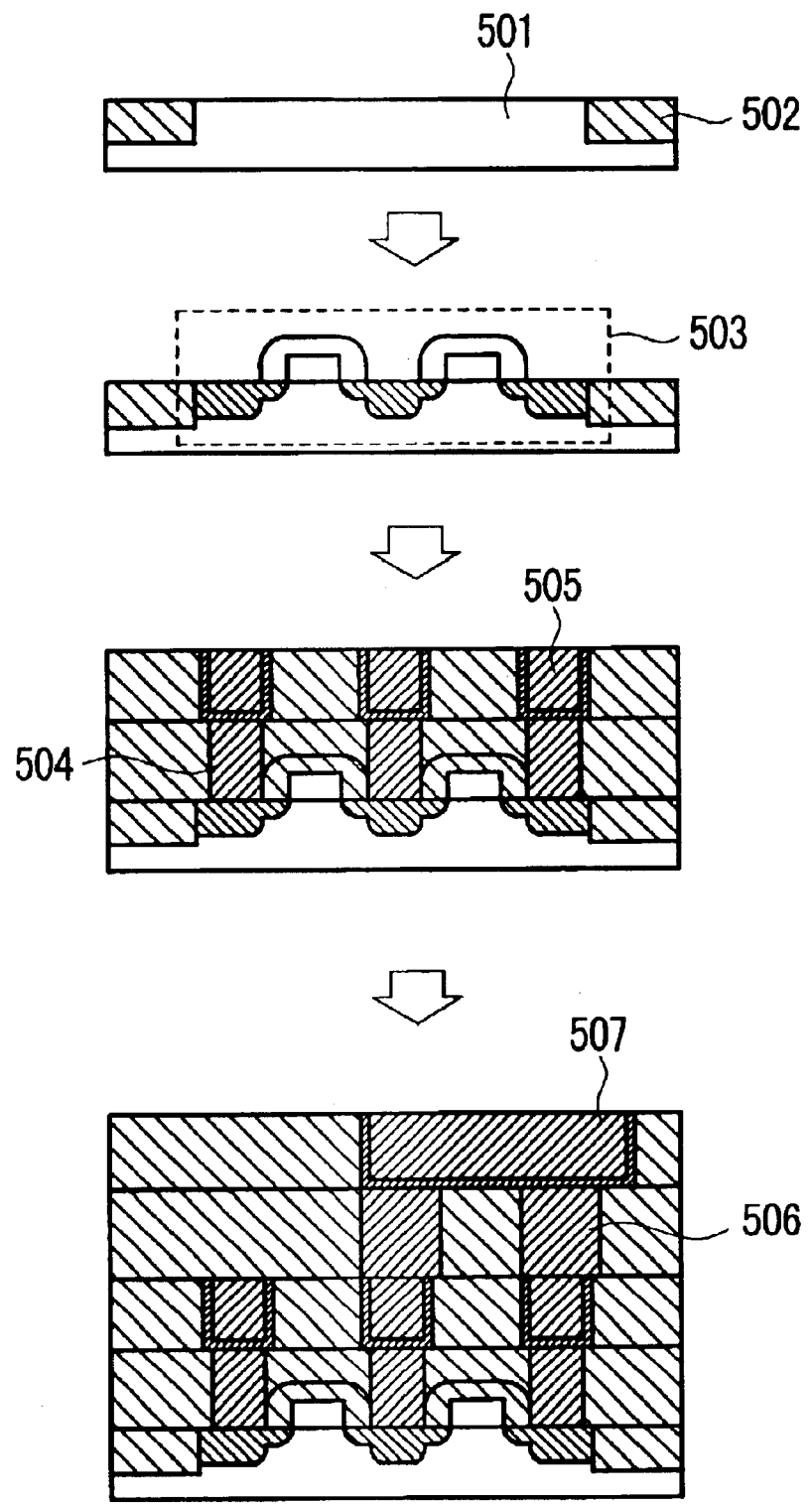
FIG. 18 is a process diagram typically showing a method of manufacturing a semiconductor device according to another embodiment of the present invention.

An embodiment for manufacturing a semiconductor device, using the present invention will next be described. FIG. 18 is a typical diagram showing a manufacturing process for the semiconductor device through the use of a cross-sectional view of a typical portion of the device. Isolation trenches 502 are first defined in an Si substrate 501 (first step in FIG. 18) and thereafter a MOS transistor gate 503 is formed (second step in FIG. 18). Further, contact holes 504 are defined (third step in FIG. 18). Afterwards, first layer interconnects (wirings) 505 and an insulating film between the wirings are formed (third step in FIG. 18), and an interlayer insulating film and first layer through holes (vias) 506 are formed thereon. Further, a second layer interconnect (wiring) 507 is formed (fourth step in FIG. 18). Wirings (not shown) of a third layer and more are also formed in the same manner as described above. In the present embodiment, an alignment method based on a method similar to one shown in the embodiment 1 was applied to alignment between the isolation trenches and the transistor gate, alignment between the transistor gate and the contact holes, alignment between the contact holes and the first layer wirings and alignment between a nth layer wiring and nth layer through holes (where n<4). Owing to the present embodiment, the accuracy of alignment between the respective layers was improved as compared with the conventional method. A semiconductor integrated circuit could be fabricated with high accuracy, high yields and high throughput.

According to the present invention as described above, the asymmetry of each alignment mark used for the alignment is measured prior to the alignment between a mask and a wafer. Alignment is performed in consideration of the result of measurement thereof. After the elapse of a proper time, actual exposure is performed to thereby enable high-accuracy alignment even in the case where the alignment marks are asymmetric. Thus, the performance of the semiconductor device is improved. Further, manufacturing yields are enhanced and a cost reduction can be realized, without sacrificing throughput.

What is claimed is:

1. A method of manufacturing a semiconductor device, comprising the steps of:

forming a first pattern having alignment marks on a semiconductor substrate;

forming a resist film on the surface of the first pattern; aligning a second pattern formed on a mask with each of the alignment marks; and transferring the second pattern onto the resist film, wherein the aligning step includes a step of measuring asymmetry of each of the alignment marks and a step of offsetting alignment of the second pattern with the alignment marks based on measured asymmetry of each of the alignment marks, wherein the step of measuring asymmetry is based upon scatterometry and includes a step of applying light at a pair of different incident angles or polarization angles to each of the alignment marks so as to measure reflected light intensities of the lights.

2. The method according to claim 1, wherein the lights have a plurality of wavelengths.

3. The method according to claim 1, wherein the lights are single wavelength lights.

4. The method of manufacturing a semiconductor device, comprising the steps of:

forming a first pattern having alignment marks on a semiconductor substrate;

forming a resist film on the surface of the first pattern;

aligning a second pattern formed on a mask with each of the alignment marks; and transferring the second pattern onto the resist film, wherein the aligning step includes a step of measuring asymmetry of each of the alignment marks and a step of offsetting alignment of the second pattern with the alignment marks based on measured asymmetry of each of the alignment marks, wherein the step of measuring asymmetry is based upon scatterometry and includes a step of applying a light to the alignment marks from a vertical direction to thereby measure a plurality of order diffracted light intensities diffracted from the alignment marks.

5. The method according to claim 1, wherein the alignment marks include periodic pattern features or periodic pattern features provided in vicinity to the alignment marks.

6. A method of manufacturing a semiconductor device, comprising the steps of:

providing a processing equipment in which a step for coating/baking of a resist film onto a wafer having alignment marks and a step for developing the wafer are performed;

measuring asymmetry of each of the alignment marks; and measuring critical dimensions of the resist pattern, wherein the asymmetry and the critical dimensions are measured by the same measuring apparatus disposed in the processing equipment, wherein the step of measuring asymmetry is based upon scatterometry and includes a step of applying lights at a pair of different incident angles or polarization angles to each of the alignment marks so as to measure reflected light intensities of the lights or a step of applying a light to the alignment marks from a vertical direction to thereby measure a plurality of order diffracted light intensities diffracted from the alignment marks.

7. A method of manufacturing a semiconductor device, comprising a series of steps of:

coating/baking a resist on each of wafers having alignment marks to form a resist film thereon; and exposing and developing patterns on a mask onto the resist film, wherein a processing sequence for shifting a starting point of the series of steps one by one and advancing processing is provided for each wafer, and wherein after the resist coating/baking step, a step for measuring asymmetry of each of the alignment marks and a step for measuring critical dimensions of the resist pattern after the exposure and development are provided, wherein the step of measuring asymmetry is based upon scatterometry and includes a step of applying lights at a pair of different incident angles or polarization angles to each of the alignment marks so as to measure reflected light intensities of the lights or a step of applying a light to the alignment marks from a vertical direction to thereby measure a plurality of order diffracted light intensities diffracted from the alignment marks.

8. A method of manufacturing a semiconductor device, comprising the steps of:

a plural pattern forming step including a step of forming a gate electrode of a field effect transistor; and aligning a wafer having alignment marks with a mask upon the plural pattern forming step, wherein prior to the aligning step, a step of measuring asymmetry of each of the alignment marks is applied to at least the gate electrode forming step, wherein the step of measuring asymmetry is based upon scatterometry and includes a step of applying lights at a pair of different incident angles or polarization angles to each of the alignment marks so as to measure reflected light intensities of the lights or a step of applying a light to the alignment marks from a vertical direction to thereby measure a plurality of order diffracted light intensities diffracted from the alignment marks.

9. A method of manufacturing a semiconductor device, prior to alignment of a wafer having alignment marks with a mask, comprising:

measuring asymmetry of each of the alignment marks;

measuring pattern dimensions on the mask and dimensions of patterns on the mask, which have been transferred onto the wafer and deriving discrepancy from the result of measurement; and obtaining a correlation line from the result of measurement of the asymmetry and the discrepancy, wherein an amount of offset for the alignment is determined based on the correlation line, wherein the step of measuring asymmetry is base upon scatterometry and includes a step of applying lights at a pair of different incident angles or polarization angles to each of the alignment marks so as to measure reflected light intensities of the lights or a step of applying a light to the alignment marks from a vertical direction to thereby measure a plurality of order diffracted light intensities diffracted from the alignment marks.

10. The method according to claim 4, wherein the alignment marks include periodic pattern features or periodic pattern features provided in vicinity to the alignment marks.

* * * * *